US012604644B2

(12) United States Patent
Hu et al.

(10) Patent No.: US 12,604,644 B2
(45) Date of Patent: Apr. 14, 2026

(54) DISPLAY PANEL AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Ming Hu, Beijing (CN); Bo Shi, Beijing (CN); Du Chen, Beijing (CN); Taofeng Xie, Beijing (CN); Qixiao Wu, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 402 days.

(21) Appl. No.: 18/039,267

(22) PCT Filed: Jun. 30, 2022

(86) PCT No.: PCT/CN2022/102674
§ 371 (c)(1),
(2) Date: May 29, 2023

(87) PCT Pub. No.: WO2024/000355
PCT Pub. Date: Jan. 4, 2024

(65) Prior Publication Data
US 2024/0431181 A1 Dec. 26, 2024

(51) Int. Cl.
*H10K 59/80* (2023.01)
*H10K 59/122* (2023.01)
*H10K 59/38* (2023.01)

(52) U.S. Cl.
CPC ......... *H10K 59/879* (2023.02); *H10K 59/122* (2023.02); *H10K 59/878* (2023.02); *H10K 59/38* (2023.02); *H10K 59/8792* (2023.02)

(58) Field of Classification Search
CPC ........................... H10K 59/879; H10K 59/122
See application file for complete search history.

(56) References Cited

U.S. PATENT DOCUMENTS

| | | | | |
|---|---|---|---|---|
| 2012/0313552 | A1* | 12/2012 | Chang | H10K 59/122 |
| | | | | 315/312 |
| 2014/0027725 | A1 | 1/2014 | Lim et al. | |

(Continued)

FOREIGN PATENT DOCUMENTS

| | | |
|---|---|---|
| CN | 104282715 A | 1/2015 |
| CN | 108761903 A | 11/2018 |

(Continued)

OTHER PUBLICATIONS

PCT/CN2022/102674 international search report.
PCT/CN2022/102674 Written Opinion.

*Primary Examiner* — Mariceli Santiago
(74) *Attorney, Agent, or Firm* — IPro, PLLC

(57) ABSTRACT

A display panel includes a substrate, a light emitting layer, a packaging layer, a plurality of lens elements and a transparent layer. The transparent layer is disposed on the side of the packaging layer away from the light emitting layer, at least a portion of the transparent layer is disposed between adjacent lens elements, and a projection of the transparent layer on the substrate overlaps at least partially with a projection of the light emitting unit on the substrate. The lens element has a side surface in contact with the transparent layer, and a refractive index of the lens element at the side surface is smaller than a refractive index of the transparent layer.

20 Claims, 8 Drawing Sheets

(56)     References Cited

U.S. PATENT DOCUMENTS

| | | | |
|---|---|---|---|
| 2015/0008399 A1 | 1/2015 | Choi et al. | |
| 2016/0064694 A1 | 3/2016 | Choi et al. | |
| 2019/0221778 A1* | 7/2019 | Kim | H10K 59/352 |
| 2019/0250464 A1 | 8/2019 | Kuo et al. | |
| 2020/0357854 A1 | 11/2020 | Koshihara | |
| 2020/0411800 A1 | 12/2020 | Wang | |
| 2023/0060696 A1 | 3/2023 | Li et al. | |
| 2023/0116030 A1 | 4/2023 | Sui et al. | |
| 2023/0172036 A1 | 6/2023 | Xu et al. | |

FOREIGN PATENT DOCUMENTS

| | | | | |
|---|---|---|---|---|
| CN | 110021647 A | 7/2019 | | |
| CN | 110323354 A | 10/2019 | | |
| CN | 111108602 A | 5/2020 | | |
| CN | 111338108 A | 6/2020 | | |
| CN | 111584754 A | 8/2020 | | |
| CN | 111599850 A | 8/2020 | | |
| CN | 111834544 A | 10/2020 | | |
| CN | 111834545 A | 10/2020 | | |
| CN | 212517209 U | 2/2021 | | |
| CN | 113394260 A | 9/2021 | | |
| CN | 113471259 A | 10/2021 | | |
| CN | 113745433 A * | 12/2021 | | H10K 59/122 |
| CN | 215578616 U | 1/2022 | | |
| CN | 216145641 U | 3/2022 | | |
| CN | 114267775 A | 4/2022 | | |
| CN | 114284314 A | 4/2022 | | |
| CN | 114497421 A | 5/2022 | | |
| WO | WO-2022088992 A1 * | 5/2022 | | H10K 59/789 |

* cited by examiner

DISPLAY PANEL AND DISPLAY DEVICE

CROSS REFERENCE TO RELATED APPLICATIONS

The present application is a U.S. National Phase of International Application No. PCT/CN2022/102674, filed Jun. 30, 2022, the entire contents of which are hereby incorporated by reference for all purposes.

TECHNICAL FIELD

The present disclosure relates to the field of electronic display technology, and more particularly, to a display panel and a display device.

BACKGROUND

LED display devices have many advantages, such as self illumination, low driving voltage, high luminous efficiency, short response time, high clarity and contrast, near 180° angle of view, wide temperature range, flexible display, and large area full color display. They are widely used in display, lighting, and intelligent wearable fields.

However, in traditional OLED display devices, light ultimately needs to be directed from the high refractive index cover plate (CG) into the low refractive index air. When the incident angle of light at the interface of the cover plate reaches or exceeds the critical angle of total reflection, total internal reflection occurs, resulting in low light output efficiency of the display device.

SUMMARY

According to a first aspect of the embodiments of the present disclosure, there is provided a display panel including:

a substrate;

a light emitting layer disposed on a side of the substrate, including a plurality of light emitting units spaced apart, with a pixel definition layer disposed between adjacent light emitting units;

a packaging layer disposed on a side of the light emitting layer away from the substrate;

a plurality of lens elements disposed on a side of the packaging layer away from the light emitting layer, wherein a projection of the lens element on the substrate overlaps at least partially with a projection of the pixel definition layer on the substrate, the lens element includes a first lens and a second lens stacked in layers, the first lens is disposed adjacent to the packaging layer, and the second lens is disposed on a side of the first lens away from the packaging layer;

a transparent layer disposed on the side of the packaging layer away from the light emitting layer, wherein at least a portion of the transparent layer is disposed between adjacent lens elements, and a projection of the transparent layer on the substrate overlaps at least partially with a projection of the light emitting unit on the substrate;

wherein the lens element has a side surface in contact with the transparent layer, and a refractive index of the lens element at the side surface is smaller than a refractive index of the transparent layer.

In an embodiment, a first reflective layer is disposed on a surface of the lens element adjacent to the packaging layer, a second reflective layer is disposed on a surface of the lens element away from the packaging layer, and the first reflective layer and the second reflective layer are disposed face to face.

In an embodiment, a protrusion is disposed between the lens element and the packaging layer, the protrusion has a bottom surface adjacent to the packaging layer and a top surface adjacent to the lens element, the top surface is convex towards the lens element, and the first reflective layer is disposed on the top surface.

In an embodiment, a material of the protrusion includes a photosensitive material.

In an embodiment, the first reflective layer is in a polyline or an arc shape, and a distance between the first reflective layer and the packaging layer gradually decreases from a center to an edge.

In an embodiment, a material of the first reflective layer and/or the second reflective layer includes silver.

In an embodiment, the display panel further includes a black matrix block disposed on a side of the lens element away from the packaging layer, and a projection of the black matrix block on the substrate overlaps at least partially with a projection of the lens element on the substrate;

the black matrix block has a lower surface adjacent to the lens element and an upper surface away from the lens element, and the second reflection layer in contact with the lower surface.

In an embodiment, the second reflective layer is in a polyline or an arc shape, and a distance between the second reflective layer and the packaging layer gradually increases from a center to an edge.

In an embodiment, a slope angle between the side surface and the packaging layer is larger than or equal to 45 degrees and smaller than 90 degrees.

In an embodiment, a refractive index of the transparent layer is 1.65 to 1.7, and a refractive index of the lens element is 1.45 to 1.5.

In an embodiment, the transparent layer is a flattened layer filled between adjacent lens elements;

the display panel further includes a filter layer formed on a side of the transparent layer and the lens element away from the packaging layer.

In an embodiment, the transparent layer is served by a portion of the filter layer, a portion of the filter layer is filled between adjacent lens elements as the transparent layer, and another portion of the filter layer is formed on a side of the transparent layer and the lens element away from the packaging layer.

In an embodiment, the filter layer includes a red filter layer, a green filter layer, and a blue filter layer;

the side surface of the lens element is in contact with the filter layer serving as the transparent layer, and a slope angle between the side surface and the packaging layer is larger than or equal to 45 degrees but smaller than 90 degrees;

the slope angles formed by different side surfaces in contact with different color filter layers are not equal to one another.

In an embodiment, the slope angle formed by the side surface in contact with the red filter layer is larger than or equal to 65 degrees and smaller than or equal to 70 degrees;

the slope angle formed by the side surface in contact with the green filter layer is larger than or equal to 55 degrees and smaller than or equal to 60 degrees;

the slope angle of the side surface in contact with the blue filter layer is larger than or equal to 45 degrees and smaller than or equal to 50 degrees.

In an embodiment, a surface of the second lens away from the first lens is a light output surface that allows light to pass through.

In an embodiment, the light output surface of the second lens is in a polyline or an arc shape; and from a center of the light output surface to an edge of the light output surface, a distance between the light output surface and the packaging layer gradually increases or decreases.

In an embodiment, a material of the first lens is the same as that of the second lens, and a contact surface between the first lens and the second lens is a plane.

In an embodiment, a width of the lens element gradually decreases in a direction away from the packaging layer.

In an embodiment, the lens element further includes a third lens, which is disposed on a side away of the second lens or the first lens from the packaging layer, and a refractive index of the third lens is larger than that of the first lens and/or the second lens.

According to a second aspect of the embodiments of the present disclosure, there is provided a display device including a display panel described above.

It is to be understood that the above general descriptions and the below detailed descriptions are merely exemplary and explanatory, and are not intended to limit the present disclosure.

BRIEF DESCRIPTION OF THE DRAWINGS

The accompanying drawings, which are incorporated in and constitute a part of this specification, illustrate examples consistent with the present disclosure and, together with the description, serve to explain the principles of the disclosure.

DETAILED DESCRIPTION

Figure 1:
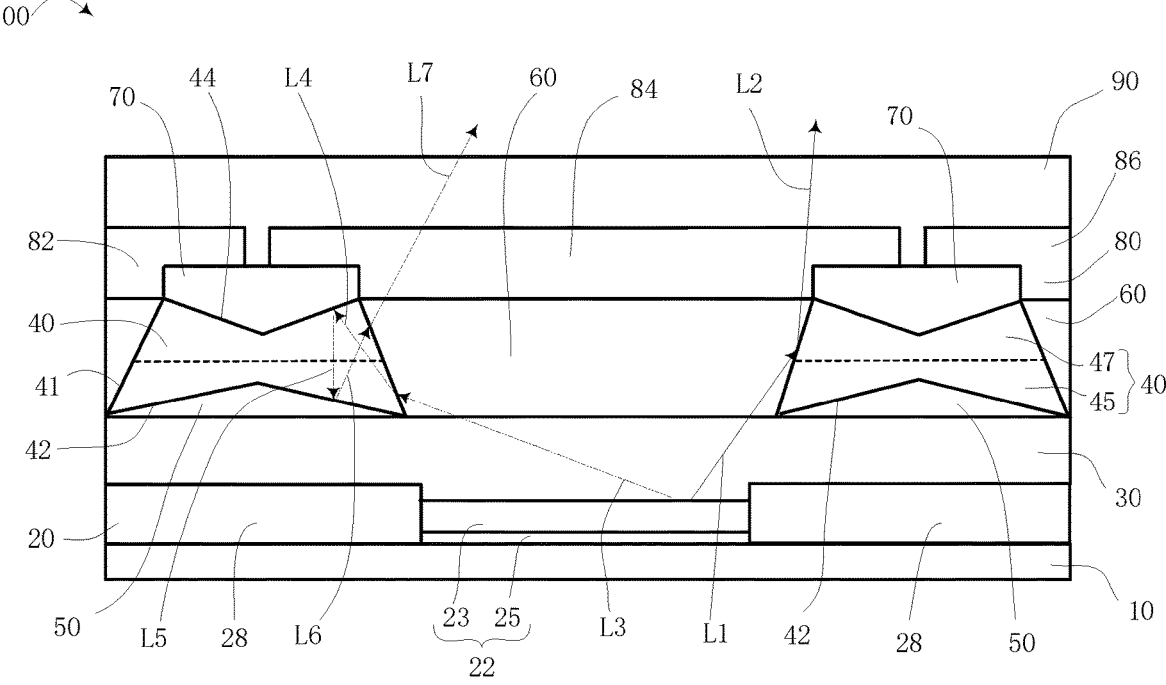
FIG. 1 is a cross-sectional structural diagram of a display panel in one embodiment of the present disclosure.

Exemplary embodiments will be described in detail herein, with the illustrations thereof represented in the drawings. When the following descriptions involve the drawings, like numerals in different drawings refer to like or similar elements unless otherwise indicated. The embodiments described in the following exemplary embodiments do not represent all embodiments consistent with the present disclosure. Rather, they are merely examples of apparatuses and methods consistent with some aspects of the present disclosure as detailed in the appended claims.

An embodiment of the present disclosure provides a display panel 100, referring to FIG. 1, including:

a substrate 10;

a light emitting layer 20 disposed on a side of the substrate 10, including a plurality of light emitting units 22 spaced apart (only one light emitting unit 22 is shown in the figure), with a pixel definition layer 28 disposed between adjacent light emitting units 22;

a packaging layer 30 disposed on a side of the light emitting layer 20 away from the substrate 10;

a plurality of lens elements 40 disposed on a side of the packaging layer 30 away from the light emitting layer

20, where a projection of the lens element 40 on the substrate 10 overlaps at least partially with a projection of the pixel definition layer 28 on the substrate 10 (i.e., the lens element 40 is disposed above the pixel definition layer 28);

a transparent layer 60 disposed on the side of the packaging layer 30 away from the light emitting layer 20, where at least a portion of the transparent layer 60 is disposed between adjacent lens elements 40, a projection of the transparent layer 60 on the substrate 10 overlaps at least partially with a projection of the light emitting unit 22 on the substrate 10 (i.e., the transparent layer 60 is disposed above the light emitting unit 22), for the light emitted by the light emitting unit 22 to pass through and enter the user's eyes;

wherein the lens element 40 has a side surface 41 in contact with the transparent layer 60, and a refractive index of the lens element 40 at the side surface 41 is smaller than that of the transparent layer 60.

In the above embodiment, by providing the lens elements 40, the light output effect of the display panel can be effectively improved. Specifically, a portion of the light emitted by the light emitting unit 22 will directly pass through the transparent layer 60 and enter the user's eyes, while the other portion will illuminate the side surface 41 of the lens element 40. At the side surface 41, when an incident angle of light (such as light L1) is larger than a critical angle of total reflection, total reflection will occur, and a reflected light L2 directly enters the user's eyes through the transparent layer 60. When the incident angle of light (such as light L3) is smaller than the critical angle of total reflection, refraction will occur, and refracted lights L4, L5, L6, and L7 will also enter the user's eyes through the lens element 40. As a result, the light output efficiency of the display panel has been significantly improved.

In some embodiments, as shown in FIG. 1, the lens element 40 is provided with a first reflection layer 42 adjacent to the surface of the packaging layer 30, and the lens element 40 is provided with a second reflection layer 44 on the surface of the lens element 40 away from the packaging layer 30. The first reflection layer 42 is face-to-face with the second reflection layer 44.

The first reflection layer 42 and the second reflection layer 44 mentioned above can reflect the light refracted into the lens element 40 from the side surface 41 once or multiple times before emitting it to the user's eyes. For example, the light L3 in FIG. 1 first refracts into the lens element 40 to form light L4, which is reflected by the second reflection layer 44 to form light L5, which is then reflected by the first reflection layer 42 to form light L6, which refracts at the side surface 41, forming light L7 and emitting upwards into the user's eyes.

Continuing with reference to FIG. 1, in some embodiments, a protrusion 50 is provided between the lens element 40 and the packaging layer 30. The protrusion 50 has a bottom surface adjacent to the packaging layer 30 and a top surface adjacent to the lens element 40, where the top surface is convex towards the lens element 40, and the first reflective layer 42 is disposed on the top surface.

In some embodiments, the material of the protrusion 50 includes/is a photosensitive material. Here, the photosensitive material can be a positive acrylic material. Acrylic, also known as PMMA or organic glass, has a chemical name of polymethyl methacrylate.

Figure 3:
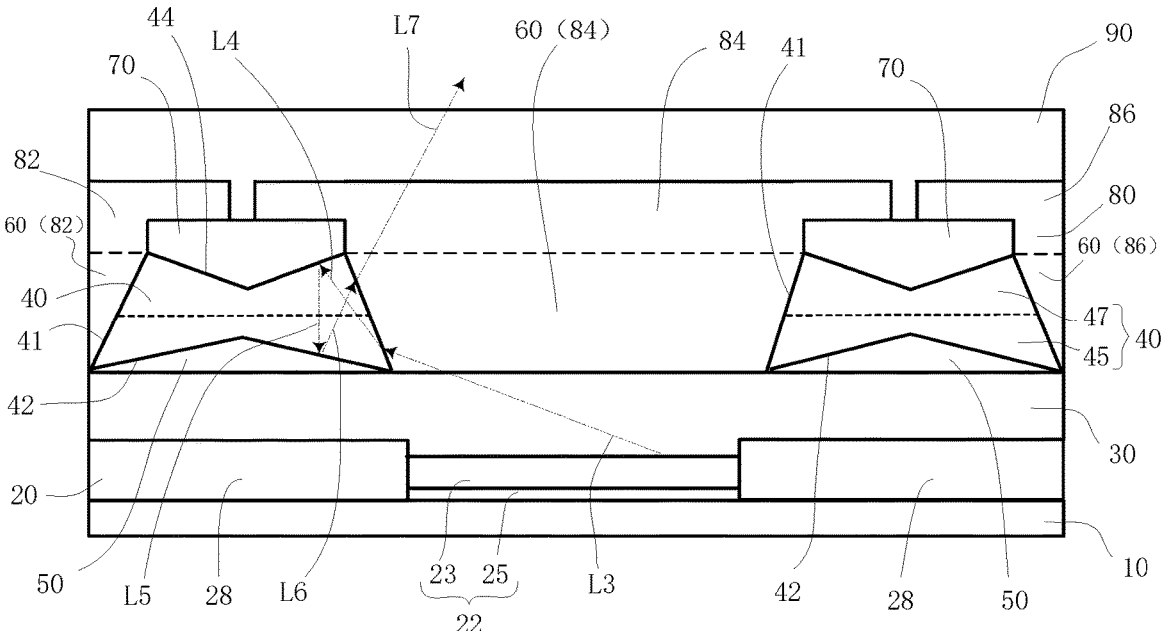
FIGS. 3 to 5 are cross-sectional structural diagrams of variations of the display panel in the embodiment of FIG. 1.
Figure 4:
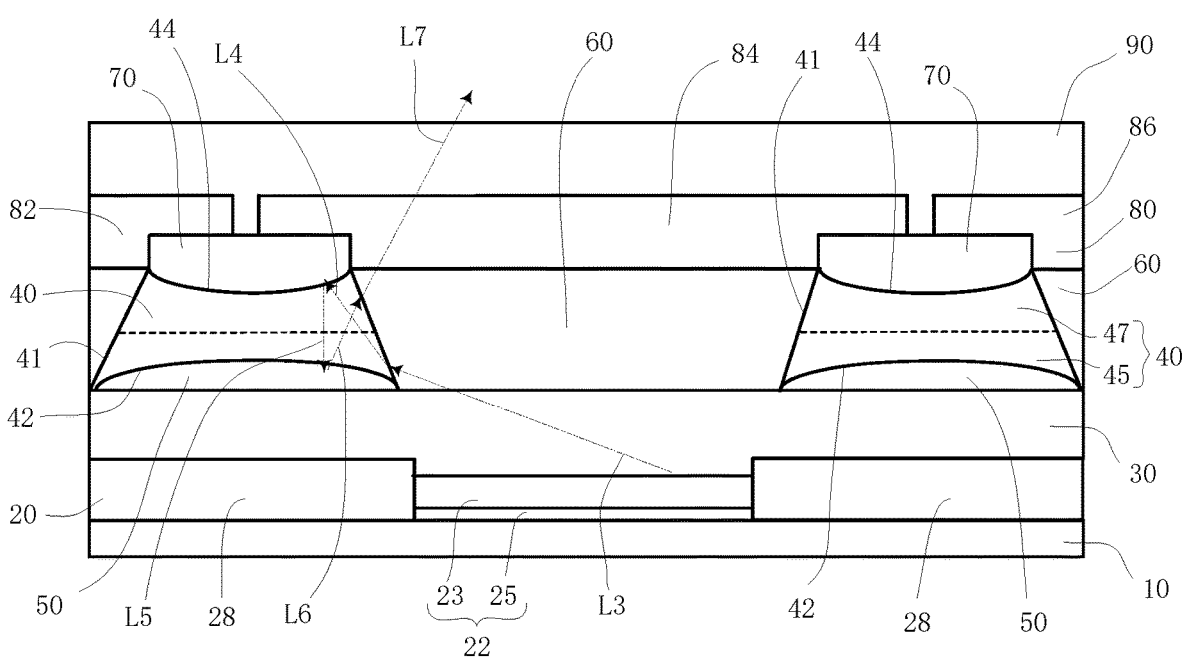
Figure 5:
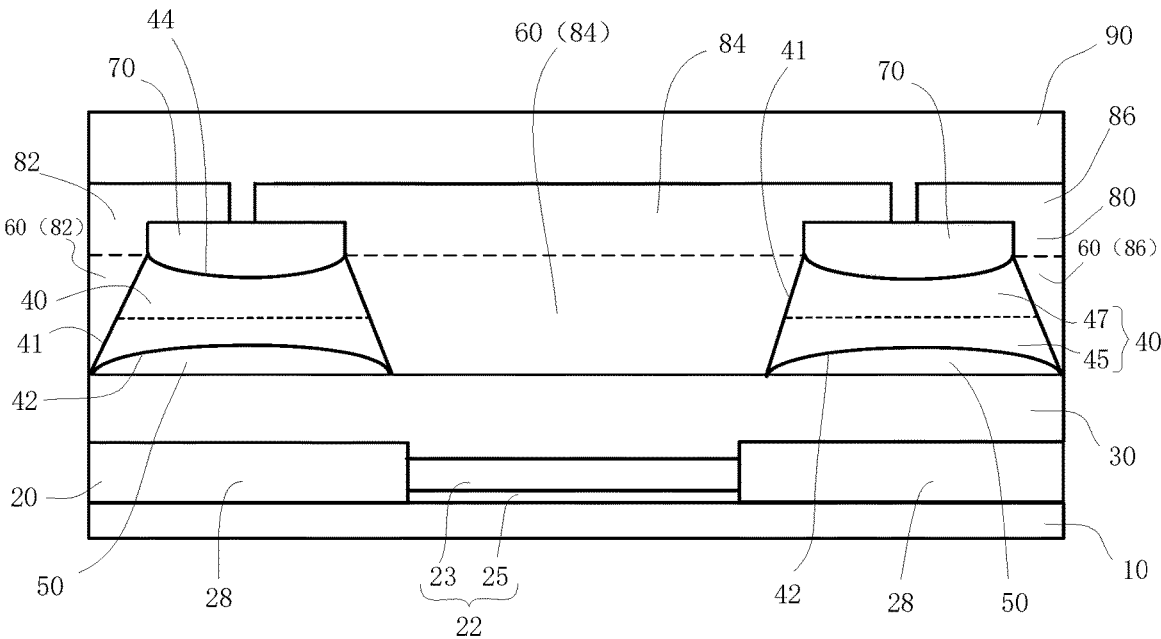

In some embodiments, the first reflective layer 42 is in a polyline shape, which is formed by connecting two or more segments of straight lines, as shown in FIGS. 1 and 3. In some embodiments, the first reflective layer 42 is in an arc shape, as shown in FIGS. 4 and 5. The arc can be a standard arc or an irregular curve. Whether in a polyline shape or an arc shape, the first reflective layer 42 is preferably in a convex shape. That is, along a direction from the center of the first reflection layer 42 to the edge of the first reflection layer 42, the distance between the first reflection layer 42 and the packaging layer 30 gradually decreases.

In some embodiments, the material of the first reflective layer 42 and/or the second reflective layer 44 includes/is silver (Ag).

In some embodiments, the light emitting units 22 are divided into a red light emitting unit for emitting red light, a green light emitting unit for emitting green light, and a blue light emitting unit for emitting blue light. Each light emitting unit 22 includes a light emitting material layer 23 and two electrodes disposed on both sides of the light emitting material layer 23. Only the anode 25 disposed below the light emitting material layer 23 is shown in FIG. 1.

Continuing with reference to FIG. 1, in some embodiments, the display panel 100 also includes a plurality of black matrix blocks 70 spaced apart, which form a black matrix (BM). The black matrix block 70 is disposed on the side of the lens element 40 away from the packaging layer 30, and the projection of the black matrix block 70 on the substrate 10 overlaps at least partially with the projection of the lens element 40 on the substrate 10, that is, the black matrix block 70 is disposed above the lens element 40.

The black matrix block 70 has a lower surface adjacent to the lens element 40 and an upper surface away from the lens element 40, and the second reflection layer 44 is in contact with the lower surface of the black matrix block 70 (or in other words, the second reflection layer 44 is laminated to the lower surface of the black matrix block 70).

In some embodiments, the second reflective layer 44 is in a polyline shape, which is formed by connecting two or more segments of straight lines, as shown in FIGS. 1 and 3. In some embodiments, the second reflective layer 44 is in an arc shape, as shown in FIGS. 4 and 5. The arc can be a standard arc or an irregular curve. Whether in a polyline shape or an arc shape, the second reflective layer 44 is preferably in a convex shape. That is, along a direction from the center of the second reflective layer 44 to the edge of the second reflective layer 44, the distance between the second reflective layer 44 and the packaging layer 30 gradually decreases.

In some embodiments, the width of the lens element 40 gradually decreases in a direction away from the packaging layer 30. That is, the lens element 40 is in a narrow top and wide bottom shape. In some embodiments, the slope angle between the side surface 41 and the packaging layer 30 is larger than or equal to 45 degrees and smaller than 90 degrees. Preferably, the slope angle is larger than or equal to 45 degrees and smaller than or equal to 70 degrees. Even more preferably, the slope angle is around 55 degrees. After multiple experiments, it has been verified that the shape of the lens element 40 with narrow top and wide bottom, and the slope angle with the above values are conducive to further improving the light output efficiency of the display panel.

In some embodiments, the lens element 40 includes a first lens 45 and a second lens 47 stacked in layers, the first lens 45 being adjacent to the packaging layer 30, and the second lens 47 being disposed on the side of the first lens 45 away from the packaging layer 30. The lens element 40 is divided into two parts: the first lens 45 and the second lens 47, which can facilitate the arrangement of the first reflection layer 42 and the second reflection layer 44.

In some embodiments, the material of the first lens 45 is the same as that of the second lens 47, and the contact surface between the first lens 45 and the second lens 47 is a plane. In some embodiments, the lens element 40 may only include one lens, which has the same overall morphology as the first lens 45 and the second lens 47.

In some embodiments, the transparent layer 60 and the lens element 40 are made of optical adhesives of different materials. Here, the refractive index of the transparent layer 60 is 1.65 to 1.7, and the refractive index of the lens element 40 is 1.45 to 1.5.

In some embodiments, as shown in FIGS. 1 and 4, the transparent layer 60 is a flattened layer completely filled between adjacent lens elements 40. The transparent layer 60 does not extend above the lens element 40. The display panel 100 also includes a filter layer 80 and an optical adhesive layer 90. The filter layer 80 is formed on the side of the transparent layer 60 and the lens element 40 away from the packaging layer 30. The optical adhesive layer 90 is formed on the side of the filter layer 80 away from the lens element 40. The optical adhesive layer 90 is a transparent material that allows light to pass through. Moreover, the optical adhesive layer 90 has a certain thickness and is a flowable material during the formation process, which can help in flattening the upper surface.

Referring to FIG. 3 or 5. In some embodiments, the transparent layer 60 is served by a part of the filter layer 80. A part of the filter layer 80 is filled between adjacent lens elements 40 as the transparent layer 60. The other part of the filter layer 80 is formed on the side of the transparent layer 60 and the lens element 40 away from the packaging layer 30. The filter layer 80 includes a red filter layer 84, a green filter layer 86, and a blue filter layer 82. Here, the red filter layer 84 is disposed above the red light emitting unit and is used to filter out light other than the red light; the green filter layer 86 is disposed above the green emitting unit and is used to filter out light other than green light; the blue filter layer 82 is disposed above the blue emitting unit and is used to filter out light other than blue light. The side surface 41 of the lens element 40 is in contact with the filter layer 80 as the transparent layer 60, and the slope angle between the side surface 41 and the packaging layer 30 is larger than or equal to 45 degrees and smaller than 90 degrees. Moreover, the slope angles formed by different side surfaces 41 that come into contact with different color filter layers are not equal, in order to achieve a better white balance effect.

The refractive indices of the red filter layer 84, the green filter layer 86, and the blue filter layer 82 are different from one another. For example, the refractive index of the red filter layer 84 for 620 nm red light is 1.71; the refractive index of the green filter layer 86 for 550 nm green light is 1.63; the refractive index of the blue filter layer 82 for 460 nm blue light is 1.58. If all lens elements 40 are made into the same shape (made of the same material, with a refractive index of 1.47 and equal slope angle), the critical angle of total reflection at the interface between the transparent layer 60 which is served by different color filter layers and the lens element 40 will be different, respectively 59.8° (i.e. arc sin 1.47/1.71), 64.4° (i.e. arc sin 1.47/1.63), and 68.5° (i.e. arc sin 1.47/1.57). This will result in inconsistent gain in light output efficiency at different color emitting units (the smaller the total reflection critical angle is, the higher the light output efficiency will be), ultimately affecting the white balance of the display screen.

Generally speaking, the slope angle of the lens element 40 corresponding to the red filter layer 84 (i.e., the slope angle formed by the side surface 41 in contact with the red filter layer 84) is set to 65 degrees to 70 degrees (including two endpoints), and the slope angle of the lens element 40 corresponding to the green filter layer 86 (i.e., the slope angle formed by the side surface 41 in contact with the green filter layer 86) is set to 55 degrees to 60 degrees (including two endpoints), the slope angle of the lens element 40 corresponding to the blue filter layer 82 (i.e., the slope angle formed by the side surface 41 in contact with the blue filter layer 82) is set to 45 degrees to 50 degrees, thus it can achieve the white balance.

Figure 2A:
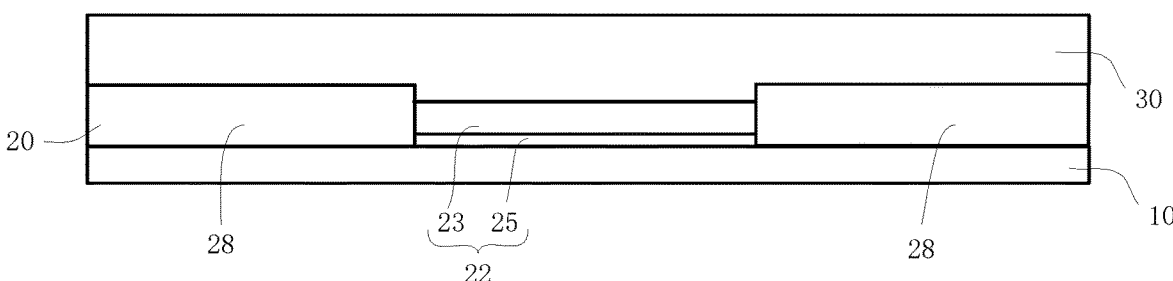
FIGS. 2A to 2G are schematic diagrams of a production process of the display panel shown in FIG. 1.

An embodiment of the present disclosure also provides a method for manufacturing a display panel, which can be used to produce the aforementioned display panel. As shown in FIG. 2A, a substrate 10 is provided first, on which a light emitting layer 20 and a packaging layer 30 have been formed. Here, the light emitting layer 20 includes a plurality of light emitting units 22 spaced apart (only one light emitting unit 22 is shown in the figure), and a pixel definition layer 28 is provided between adjacent light emitting units 22. The light emitting unit 22 can be divided into a red light emitting unit for emitting red light, a green light emitting unit for emitting green light, and a blue light emitting unit for emitting blue light. Each light emitting unit 22 includes a light emitting material layer 23 and two electrodes disposed on both sides of the light emitting material layer 23. The Figure only shows the anode 25 disposed below the light emitting material layer 23. The packaging layer 30 is disposed on the side of the light emitting layer 20 away from the substrate 10. The packaging layer 30 can be a layered structure consisting of an inorganic insulation layer, an organic insulation layer, and an inorganic insulation layer.

Figure 2B:
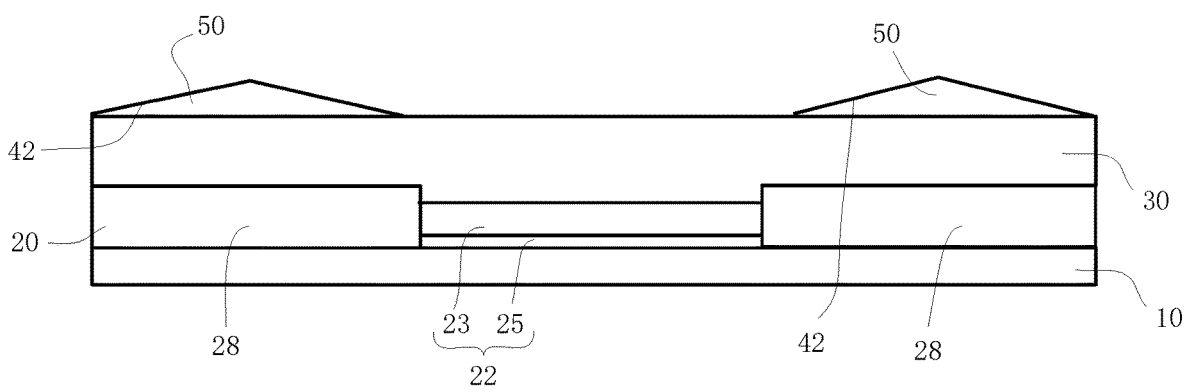

As shown in FIG. 2B, a plurality of protrusions 50 are formed above the packaging layer 30, and the protrusion 50 is disposed directly above the pixel definition layer 28. However, the boundary of the protrusion 50 does not need to completely coincide with the boundary of the pixel definition layer 28. For example, the range covered by the protrusion 50 may be slightly smaller than the range covered by the pixel definition layer 28. The top surface of the protrusion 50 can be convex. The material of the protrusion 50 can be a photosensitive material, such as a positive acrylic material. Then, a first reflective layer 42 can be formed on the top surface of the protrusion 50. The material of the first reflective layer 42 can include silver or silver.

Figure 2C:
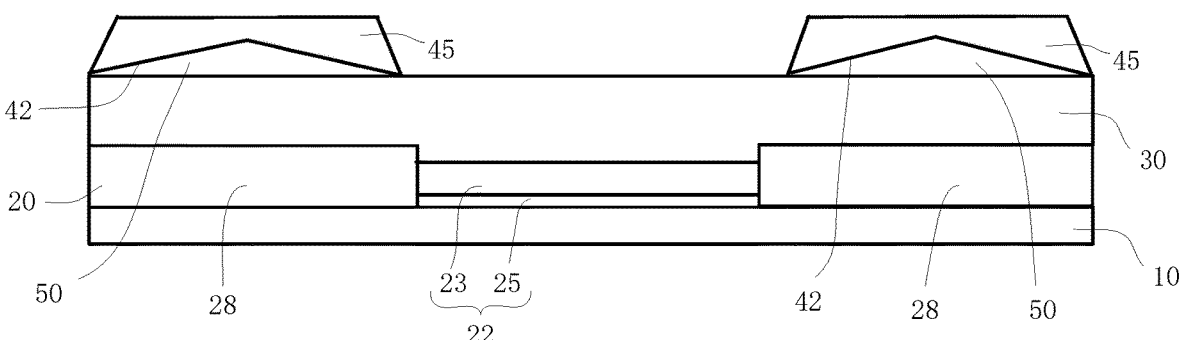

As shown in FIG. 2C, a first lens 45 is formed on the protrusion 50 and the first reflection layer 42. The first lens 45 and the protrusion 50 can form an isosceles trapezoid with a wide bottom and a narrow top. The slope angle of the first lens 45 can be between 45 degrees and 90 degrees, and the thickness can be between 1 micrometer and 3 micrometers.

Figure 2D:
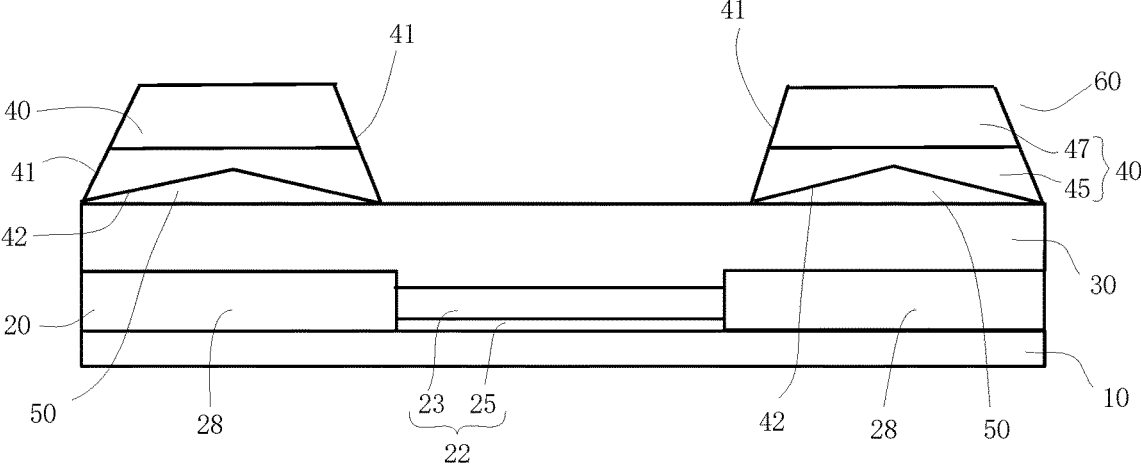
Figure 2E:
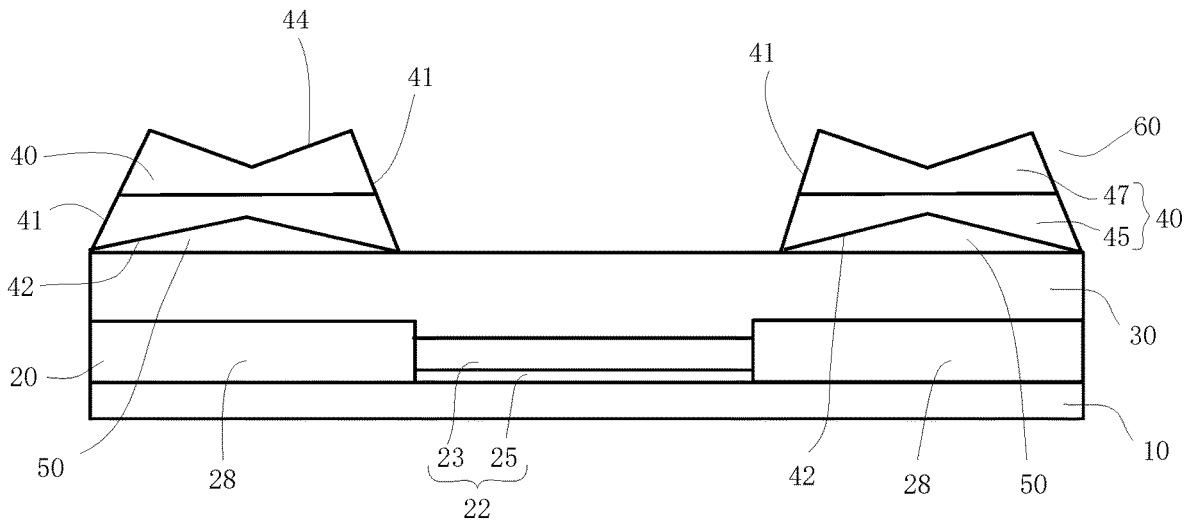
Figure 2F:
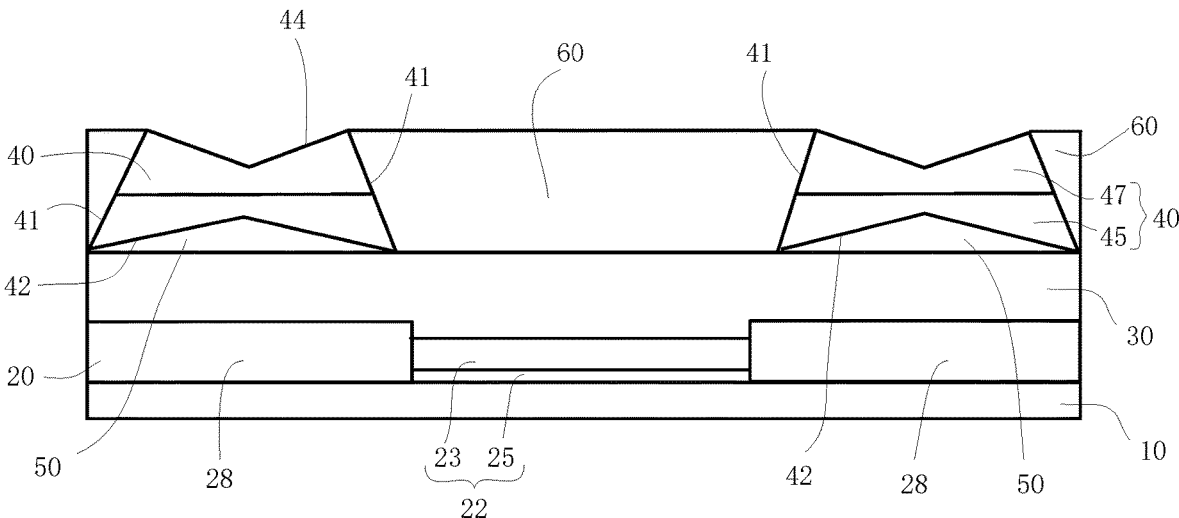

As shown in FIGS. 2D and 2E, a second lens 47 is formed above the first lens 45, and a groove is opened on the upper surface of the second lens 47. Here, the material of the second lens 47 can be the same as that of the first lens 45. Moreover, the slope angle of the second lens 47 can be between 45 degrees and 90 degrees, preferably the same as the slope angle of the first lens 45, so that the lens element 40 is in an isosceles trapezoid shape as a whole. The thickness of the second lens 47 can range from 1 micrometer to 3 micrometers. The cross section of the groove on the upper surface of the second lens 47 is preferably an inverted isosceles triangle. The slope of the groove can be from 10 degrees to 35 degrees, preferably 20 degrees.

Subsequently, a second reflective layer 44 can be formed on the surface of the groove. The planar shape of the second reflective layer 44 is the same or substantially the same as the surface of the groove. The second reflective layer 44 can also be made of silver.

As shown in FIG. 2E, a transparent layer 60 is filled between adjacent lens elements 40. Here, the material of the transparent layer 60 can be optical adhesive, and the refractive index of the transparent layer 60 can be 1.65 to 1.7. Moreover, the refractive index of the lens element 40 at the side surface 41 is lower than that of the transparent layer 60.

Figure 2G:
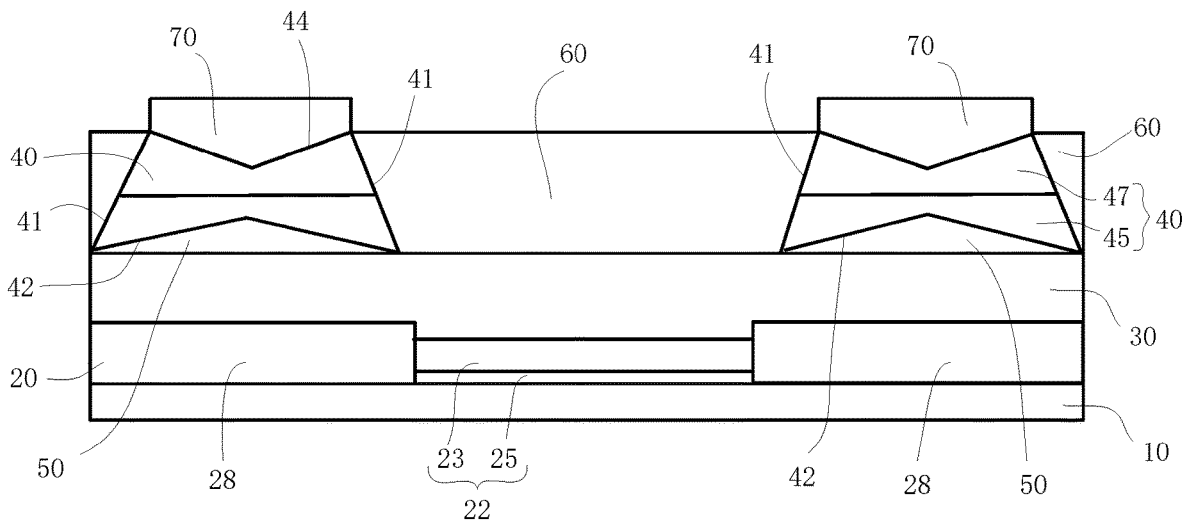

As shown in FIG. 2G, a black matrix block 70 is formed above the lens element 40 and the second reflection layer 44. Moreover, the projection of the black matrix block 70 on the substrate 10 overlaps at least partially with the projection of the lens element 40 on the substrate 10.

Finally, a filter layer 80 and an optical adhesive layer 90 are sequentially formed above the black matrix block 70 and the transparent layer 60 to obtain the display panel 100 shown in FIG. 1. The manufacturing method of the display panel in other embodiments is similar to this solution, and will not be repeated here.

Figure 6:
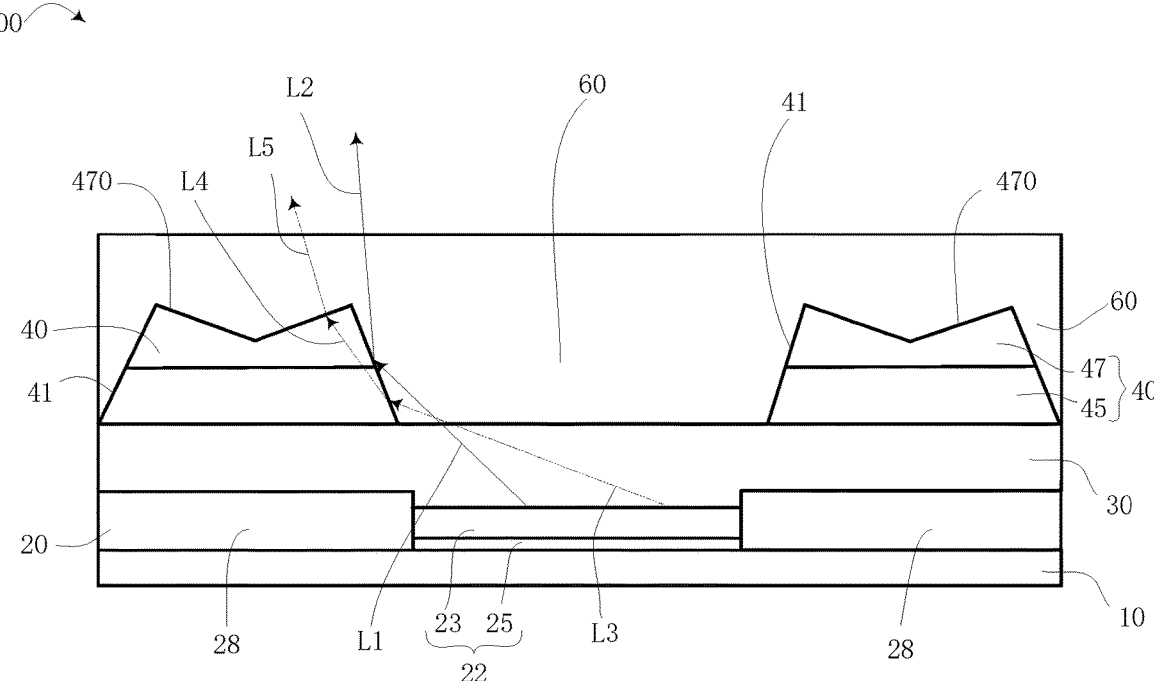
FIG. 6 is a cross-sectional structural diagram of a display panel in another embodiment of the present disclosure.

An embodiment of the present disclosure also provides a display panel 200, referring to FIG. 6, including:

a substrate 10;

a light emitting layer 20 disposed on a side of the substrate 10, including a plurality of light emitting units 22 spaced apart (only one light emitting unit 22 is shown in the figure), with a pixel definition layer 28 disposed between adjacent light emitting units 22;

a packaging layer 30 disposed on a side of the light emitting layer 20 away from the substrate 10;

a plurality of lens elements 40 disposed on a side of the packaging layer 30 away from the light emitting layer 20, where a projection of the lens element 40 on the substrate 10 overlaps at least partially with a projection of the pixel definition layer 28 on the substrate 10 (i.e., the lens element 40 is disposed above the pixel definition layer 28);

a transparent layer 60 disposed on the side of the packaging layer 30 away from the light emitting layer 20, where at least a portion of the transparent layer 60 is disposed between adjacent lens elements 40, a projection of the transparent layer 60 on the substrate 10 overlaps at least partially with a projection of the light emitting unit 22 on the substrate 10 (i.e., the transparent layer 60 is disposed above the light emitting unit 22), for the light emitted by the light emitting unit 22 to pass through and enter the user's eyes;

wherein the lens element 40 has a side surface 41 in contact with the transparent layer 60, and a refractive index of the lens element 40 at the side surface 41 is smaller than that of the transparent layer 60.

In the above embodiment, by providing the lens elements 40, the light output effect of the display panel can be effectively improved. Specifically, a portion of the light emitted by the light emitting unit 22 will directly pass through the transparent layer 60 and enter the user's eyes, while the other portion will illuminate the side surface 41 of the lens element 40. At the side surface 41, when an incident angle of light (such as light L1) is larger than a critical angle of total reflection, total reflection will occur, and a reflected light L2 directly enters the user's eyes through the transparent layer 60. When the incident angle of light (such as light L3) is smaller than the critical angle of total reflection, refraction will occur, and refracted lights L4 and L5 will also enter the user's eyes through the lens element 40. As a result, the light output efficiency of the display panel has been significantly improved.

Continuing with reference to FIG. 6, in some embodiments, the lens element 40 includes a first lens 45 and a second lens 47 stacked in layers. The first lens 45 is adjacent to the packaging layer 30, and the second lens 47 is disposed on the side of the first lens 45 away from the packaging layer 30. Moreover, the surface of the second lens 47 away from the first lens 45 (the upper surface of the second lens 47 in FIG. 6) is a light output surface 470 that allows light to pass through. For example, the light L3 in FIG. 6 first refracts into the lens element 40 to form light L4, then refracts again from the light output surface 470 (the upper surface of the second lens 47) to form light L5, and then enters the user's eyes. The light L5 formed after being adjusted by the lens element 40 is closer to the direction of the positive viewing angle than the original light L3, thereby improving the light output efficiency of the display panel at the positive viewing angle.

The projection of the first lens 45 on the substrate 10 usually falls completely within the projection of the pixel definition layer 28 on the substrate 10. That is, the first lens 45 does not extend directly above the emitting unit 22. The distance between the boundary of the lower surface of the first lens 45 and the boundary of the pixel definition layer 28 can usually be set to 0 to 5 microns.

Figure 7:
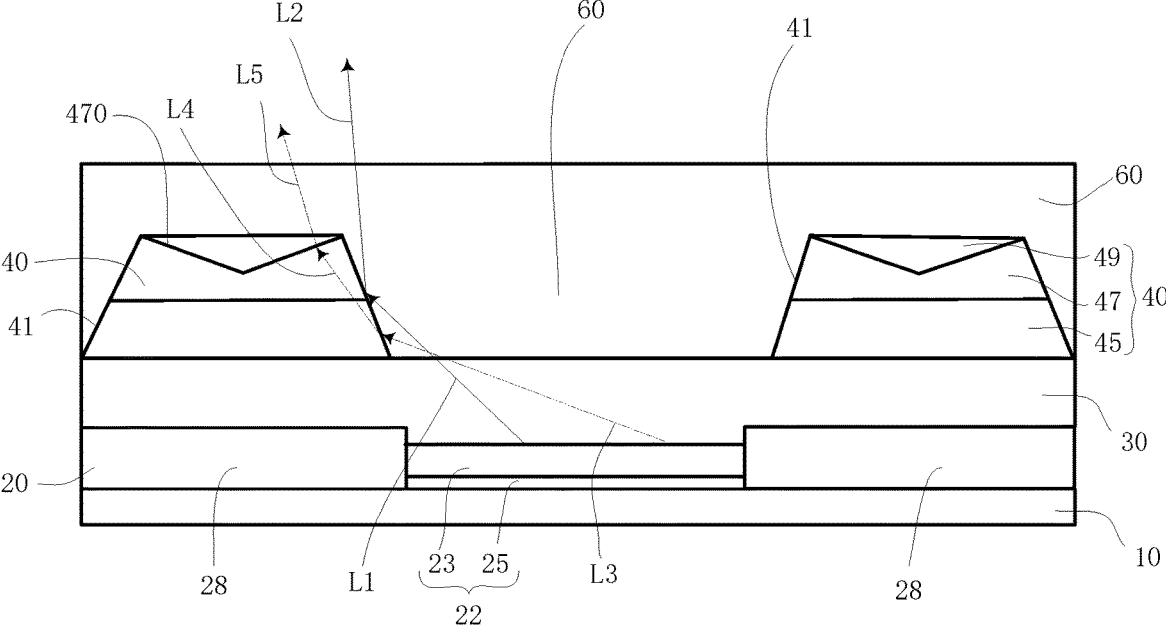
FIGS. 7 to 11 are cross-sectional structural diagrams of variations of the display panel in the embodiment of FIG. 6.
Figure 8:
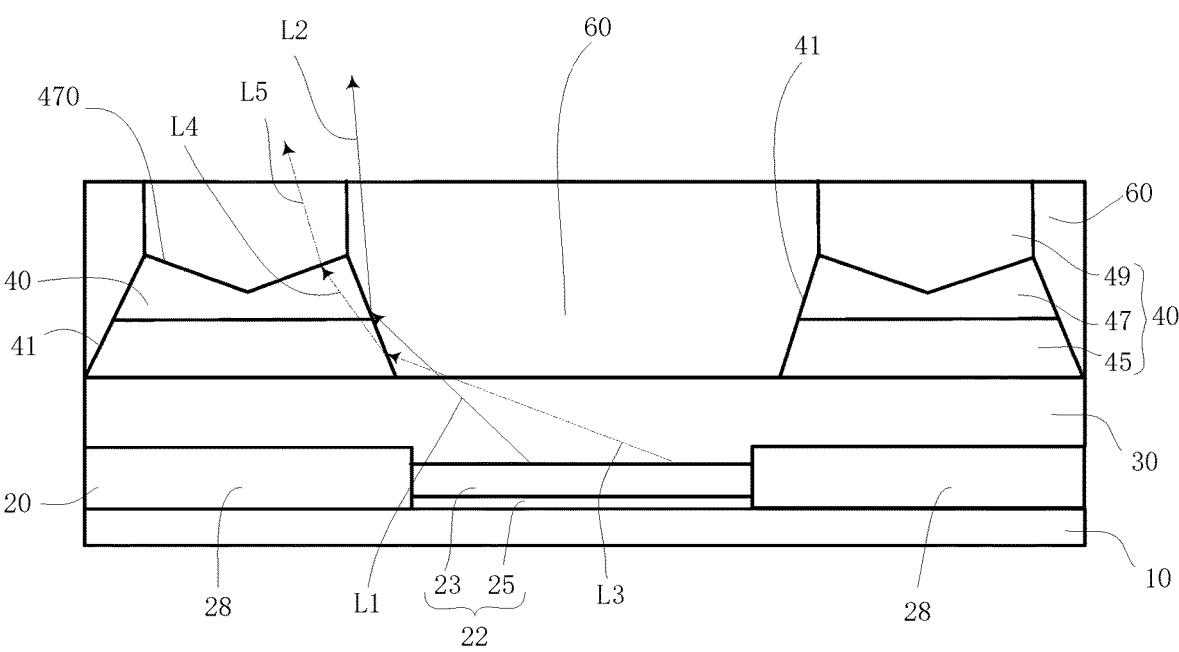
Figure 9:
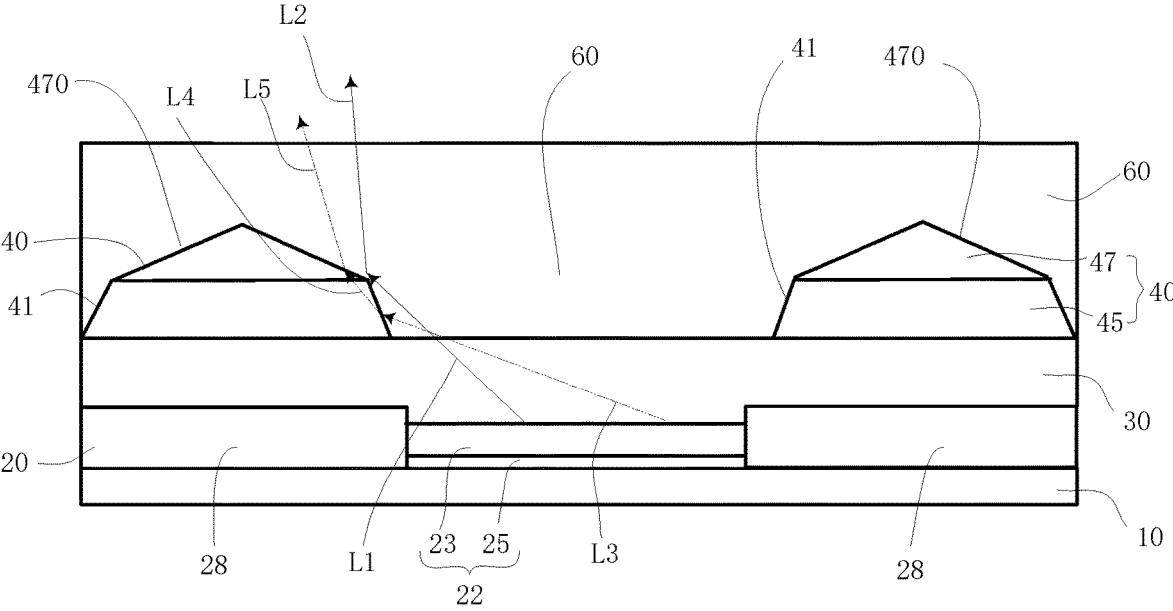
Figure 10:
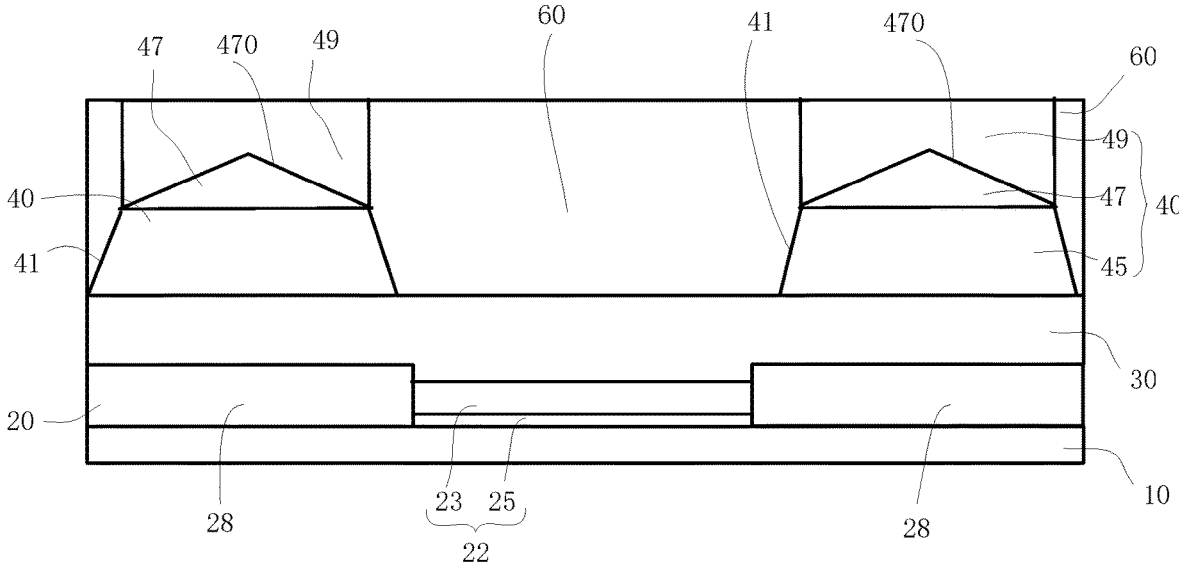

In some embodiments, the light output surface 470 of the second lens 47 is in the shape of a polyline, which is formed by connecting two or more segments of straight lines. In some embodiments, the light output surface 470 of the second lens 47 is in an arc shape. The arc can be a standard arc or an irregular curve. Whether in a polyline shape or an arc shape, the light output surface 470 of the second lens 47 is preferably in a shape with continuously changing gradient. For example, along the direction from the center of the light output surface 470 to the edge of the light output surface 470, the distance between the light output surface 470 and the packaging layer 30 gradually increases, as shown in FIGS. 6, 7, and 8. At this point, it is equivalent to having grooves on the light output surface 470 of the second lens 47. The cross section of the groove is preferably an inverted isosceles triangle. The slope of the groove can be from 10 degrees to 35 degrees, preferably 20 degrees. For example, along the direction from the center of the light output surface 470 to the edge of the light output surface 470, the distance between the light output surface 470 and the packaging layer 30 gradually decreases, as shown in FIGS. 9 and 10. The gradient of the light output surface 470 is conducive to further improving the light output efficiency.

In some embodiments, the material of the first lens 45 is the same as that of the second lens 47, and the contact surface between the first lens 45 and the second lens 47 is a plane. In some embodiments, the lens element 40 may only include one lens, which has the same overall morphology as the first lens 45 and the second lens 47.

In some embodiments, the width of the lens element 40 gradually decreases in a direction away from the packaging layer 30. That is, the lens element 40 is in a narrow top and wide bottom shape. In some embodiments, the slope angle between the side surface 41 and the packaging layer 30 is larger than or equal to 45 degrees and smaller than 90 degrees. Preferably, the slope angle is larger than or equal to 45 degrees and smaller than or equal to 70 degrees. Even more preferably, the slope angle is around 55 degrees. After multiple experiments, it has been verified that the shape of the lens element 40 with narrow top and wide bottom, and the slope angle with the above values are conducive to further improving the light output efficiency of the display panel.

In some embodiments, the transparent layer 60, the first lens 45, and the second lens 47 are made of optical adhesives of different materials. Here, the refractive index of the transparent layer 60 is 1.65 to 1.7, and the refractive indices of the first lens 45 and the second lens 47 are 1.45 to 1.5.

In some embodiments, the transparent layer 60 is a flattened layer, filled between adjacent lens elements 40, and covered on the side of the lens element 40 away from the packaging layer 30, as shown in FIGS. 6, 7, and 9.

The lens element 40 may also include a third lens 49, with a refractive index larger than that of the first lens 45 and the second lens 47. In some embodiments, the refractive index of the third lens 49 is not only larger than that of the first lens 45 and the second lens 47, but also larger than that of the transparent layer 60. For example, the third lens 49 can be made of optical adhesive with a refractive index of 1.7.

Figure 11:
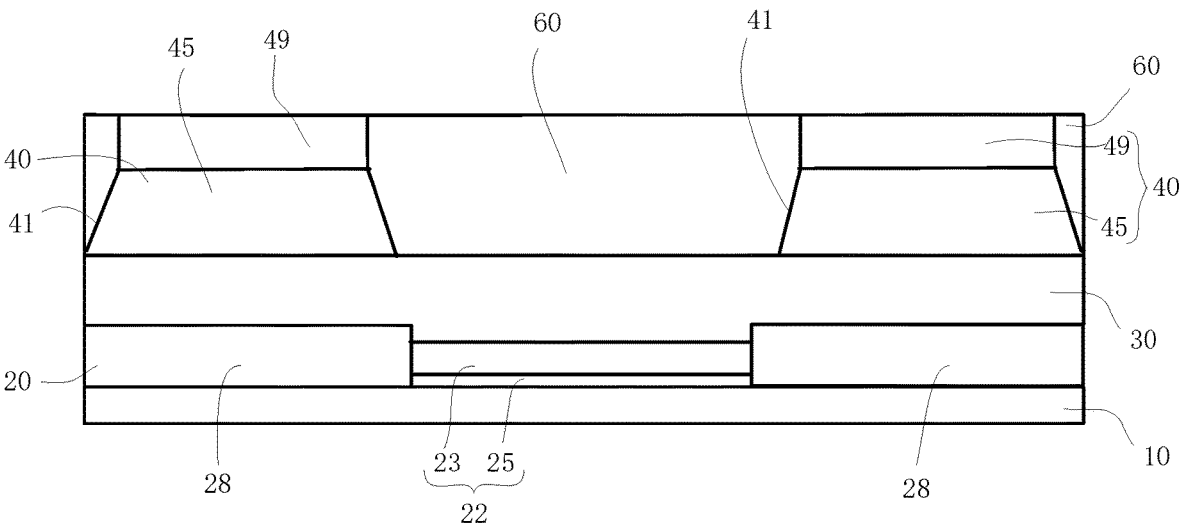

In some embodiments, the third lens 49 is disposed on the side of the second lens 47 away from the packaging layer 30, as shown in FIGS. 7, 8, and 10. In some embodiments, the third lens 49 is directly disposed on the side of the first lens 45 away from the packaging layer 30, without the second lens 47, as shown in FIG. 11. In some embodiments, the side of the third lens 49 away from the packaging layer 30 is covered by a transparent layer 60, as shown in FIG. 7. In some embodiments, the side of the third lens 49 away from the packaging layer 30 is not covered by the transparent layer 60, as shown in FIGS. 8, 10, and 11. By setting the third lens 49, the light can be further adjusted to make the light formed after being adjusted by the lens element 40 closer to the direction of the positive viewing angle, thereby improving the light output efficiency of the display panel at the positive viewing angle.

In some embodiments, each light emitting unit 22 includes a light emitting material layer 23 and two electrodes disposed on both sides of the light emitting material layer 23. Only the anode 25 disposed below the light emitting material layer 23 is shown in FIG. 6.

Through simulation testing, the light output gain of a conventional display panels is 12%. The light output gains of the display panels in FIGS. 6 to 10 are 14.30%, 16.10%, 16.30%, 14.50%, and 16.20%, respectively, which are significantly better than the conventional display panel in terms of light output gain. The light output gain of the display panel in FIG. 11 is 12.80%, which is also better than the conventional display panel in terms of light output gain.

An embodiment of the present disclosure also provides a display device, including any of the above display panels.

It should be pointed out that in the accompanying drawings, the dimensions of layers and regions may be exaggerated for clarity. And it can be understood that when a component or layer is referred to as "on" another component or layer, it can be directly on other components or there can be intermediate layers. Furthermore, it can be understood that when a component or layer is referred to as "under" another component or layer, it can be directly under other components, or there can be more than one intermediate layer or component. Furthermore, it can be understood that when a layer or component is referred to as "between" two layers or components, it can be the only layer between two layers or components, or there can also be more than one intermediate layer or component. Similar reference numerals throughout indicate similar components. The term "a plurality of" refers to two or more, unless otherwise specified.

Other embodiments of the disclosure will be apparent to those skilled in the art from consideration of the specification and practice of the embodiments disclosed here. This application is intended to cover any variations, uses, or adaptations of the disclosure following the general principles thereof and including such departures from the present disclosure as come within known or customary practice in the art. It is intended that the specification and examples be considered as exemplary only, with a true scope and spirit of the disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the disclosure only be limited by the appended claims.

What is claimed is:

1. A display panel comprising:

a substrate;

a light emitting layer on a side of the substrate, comprising a plurality of light emitting units spaced apart, with a pixel definition layer among the light emitting units;

a packaging layer on a side of the light emitting layer away from the substrate;

lens elements on a side of the packaging layer away from the light emitting layer, wherein a projection of a lens element of the lens elements on the substrate overlaps at least partially with a projection of the pixel definition layer on the substrate, the lens element comprises a first lens and a second lens stacked in layers, the first lens is adjacent to the packaging layer, and the second lens is on a side of the first lens away from the packaging layer;

a transparent layer on the side of the packaging layer away from the light emitting layer, wherein at least a portion of the transparent layer is between the lens elements, and a projection of the transparent layer on the substrate overlaps at least partially with a projection of a light emitting unit of the light emitting units on the substrate; wherein the transparent layer directly contacts sidewalls of both of the first lens and the second lens;

wherein the lens element has a side surface in contact with the transparent layer, and a refractive index of the lens element at the side surface is smaller than a refractive index of the transparent layer.

2. The display panel of claim 1, further comprising a first reflective layer on a surface of the lens element adjacent to the packaging layer, a second reflective layer on a surface of the lens element away from the packaging layer, and wherein the first reflective layer and the second reflective layer are face to face.

3. The display panel of claim 2, further comprising a protrusion between the lens element and the packaging layer, wherein the protrusion has a bottom surface adjacent to the packaging layer and a top surface adjacent to the lens element, the top surface is convex towards the lens element, and the first reflective layer is disposed on the top surface.

4. The display panel of claim 3, wherein the protrusion comprises a photosensitive material.

5. The display panel of claim 3, wherein the first reflective layer is in a polyline or an arc shape, and a distance between the first reflective layer and the packaging layer decreases from a center to an edge.

6. The display panel of claim 2, wherein the first reflective layer and/or the second reflective layer each comprise silver.

7. The display panel of claim 2, further comprising a black matrix block on a side of the lens element away from the packaging layer, wherein a projection of the black matrix block on the substrate overlaps at least partially with a projection of the lens element on the substrate;

wherein the black matrix block has a lower surface adjacent to the lens element and an upper surface away from the lens element, and the second reflection layer is in contact with the lower surface.

8. The display panel of claim 7, wherein the second reflective layer is in a polyline or an arc shape, and a distance between the second reflective layer and the packaging layer increases from a center to an edge.

9. The display panel of claim 2, wherein a slope angle between the side surface and the packaging layer is larger than or equal to 45 degrees and smaller than 90 degrees.

10. The display panel of claim 2, wherein a refractive index of the transparent layer is 1.65 to 1.7, and a refractive index of the lens element is 1.45 to 1.5.

11. The display panel of claim 2, wherein the transparent layer is a flattened layer filled between adjacent lens elements;

wherein the display panel further comprises a filter layer on a side of the transparent layer and the lens element away from the packaging layer.

12. The display panel of claim 11, wherein a portion of the filter layer is filled between the lens elements as the transparent layer, and another portion of the filter layer is on a side of the transparent layer and the lens element away from the packaging layer.

13. The display panel of claim 12, wherein the filter layer comprises a red filter layer, a green filter layer, and a blue filter layer;

the side surface of the lens element is in contact with the filter layer, and a slope angle between the side surface and the packaging layer is larger than or equal to 45 degrees but smaller than 90 degrees;

slope angles formed by different side surfaces in contact with different color filter layers are not equal to one another.

14. The display panel of claim 13, wherein a slope angle formed by the side surface in contact with the red filter layer is larger than or equal to 65 degrees and smaller than or equal to 70 degrees;

a slope angle formed by the side surface in contact with the green filter layer is larger than or equal to 55 degrees and smaller than or equal to 60 degrees;

a slope angle of the side surface in contact with the blue filter layer is larger than or equal to 45 degrees and smaller than or equal to 50 degrees.

15. The display panel of claim 2, wherein a material of the first lens is the same as that of the second lens, and a contact surface between the first lens and the second lens is a plane.

16. The display panel of claim 2, wherein a width of the lens element decreases in a direction away from the packaging layer.

17. The display panel of claim 1, wherein a surface of the second lens away from the first lens is a light output surface that allows light to pass through.

18. The display panel of claim 17, wherein the light output surface of the second lens is in a polyline or an arc shape; and wherein from a center of the light output surface to an edge of the light output surface, a distance between the light output surface and the packaging layer increases or decreases.

19. The display panel of claim 17, wherein the lens element further comprises a third lens on a side of the second lens or the first lens away from the packaging layer, and wherein a refractive index of the third lens is larger than that of the first lens or the second lens.

20. A display device comprising a display panel of claim 1.

* * * * *